(12) United States Patent
Cornell (10) Patent No.: US 9,003,359 B2
(45) Date of Patent: *Apr. 7, 2015

(54) USER CUSTOMIZABLE QUERIES TO POPULATE MODEL DIAGRAMS

(75) Inventor: Kevin James Cornell, Kanata (CA)

(73) Assignee: International Business Machines Corporation, Armonk, NY (US)

( * ) Notice: Subject to any disclaimer, the term of this patent is extended or adjusted under 35 U.S.C. 154(b) by 1051 days.

This patent is subject to a terminal disclaimer.

(21) Appl. No.: 12/879,654

(22) Filed: Sep. 10, 2010

(65) Prior Publication Data

US 2011/0072411 A1 Mar. 24, 2011

(30) Foreign Application Priority Data

Sep. 22, 2009 (CA) .................................... 2684438

(51) Int. Cl.
- G06F 9/44 (2006.01)
- G06F 17/30 (2006.01)
- G06F 17/50 (2006.01)

(52) U.S. Cl.
CPC G06F 17/50 (2013.01); G06F 8/10 (2013.01); G06F 17/30572 (2013.01)

(58) Field of Classification Search
None
See application file for complete search history.

(56) References Cited

U.S. PATENT DOCUMENTS

| | | | |
|---|---|---|---|
| 5,577,241 A * | 11/1996 | Spencer | 1/1 |
| 6,581,054 B1 * | 6/2003 | Bogrett | 1/1 |
| 7,606,829 B2 * | 10/2009 | Dettinger et al. | 1/1 |
| 2003/0204641 A1 * | 10/2003 | Rehof et al. | 709/313 |
| 2003/0220915 A1 * | 11/2003 | Fagan et al. | 707/3 |
| 2004/0064456 A1 | 4/2004 | Fong et al. | |
| 2005/0015363 A1 * | 1/2005 | Dessloch et al. | 707/3 |
| 2006/0271505 A1 * | 11/2006 | Vierich et al. | 707/2 |
| 2007/0106974 A1 * | 5/2007 | Chafe et al. | 717/104 |
| 2008/0082494 A1 | 4/2008 | Polo-Malouvier et al. | |
| 2009/0007062 A1 | 1/2009 | Gilboa | |
| 2009/0132562 A1 | 5/2009 | Mehr et al. | |

FOREIGN PATENT DOCUMENTS

CA 2 358 670 4/2003

OTHER PUBLICATIONS

Giuseppe Santucci and Pier Angelo Sottile. "Query by Diagram: a Visual Environment for Querying Databases". Software: Practice and Experience, 1993. John Wiley & Sons, Ltd. Mar. 1993. vol. 23(3). pp. 317-340.*

(Continued)

*Primary Examiner* — Lewis A Bullock, Jr.
*Assistant Examiner* — Keith C Yuen
(74) *Attorney, Agent, or Firm* — Holland & Knight LLP; Brian J. Colandreo, Esq.; Jeffrey T. Placker, Esq.

(57) ABSTRACT

A method, computer program product, and system for visually modeling architectures or system designs are described. A method may comprise providing an architectural model having a plurality of elements of one or more types. The method may further comprise providing a platform for a user to develop a non-software code query relating to the elements of the model. The method may also comprise executing the developed query to extract one or more of the plurality of elements from the model. The method may additionally comprise populating a diagram with the extracted one or more of the plurality of elements.

9 Claims, 7 Drawing Sheets

(56) References Cited

OTHER PUBLICATIONS

Steven P. Reiss. "A Visual Query Language for Software Visualization". Human Centric Computing Languages and Environments, 2002. Proceedings. IEEE 2002. pp. 80-82.*

Reiss, Steven P. "A Visual Query Language for Software Visualization". Human Centric Computing Languages and Environments, 2002. Proceedings. IEEE. Sep. 2002.*

Stacie Hibino and Elke A. Rundensteiner. "A Visual Query Language for Identifying Temporal Trends in Video Data." In IW-MMDBMS '95: Proceedings of the International Workshop on Multi-Media Database Management Systems. pp. 74-81. Washington, DC, USA, 1995.*

John D. N. Dionisio and Alfonso F. Cardenas. "MQuery: A Visual Query Language for Multimedia, Timeline and Simulation Data". Journal of Visual Languages and Computing. vol. 7, No. 4. pp. 377-401. 1996.*

Robinson, et al., Finding Resusable UML Sequence Diagrams Automatically, IEEE Software, IEEE Computer Society, 0740-7459, 2004.

* cited by examiner

USER CUSTOMIZABLE QUERIES TO POPULATE MODEL DIAGRAMS

RELATED APPLICATIONS

This application claims priority of Canadian Patent Application Serial No. 2684438 entitled "User Customizable Queries To Populate Model Diagrams", filed on Sep. 22, 2009.

BACKGROUND OF THE INVENTION

The present invention relates to visual modeling of architectures or system designs, and, more specifically, to user customizable queries to populate model diagrams with elements of a model.

In model driven development (MDD), domain specialists, system architects and developers may communicate the architecture of a business or the design of a system, which may include software programs, through visual models. Different types of elements may be used in the model to represent the domain concepts, relationships and processes. To enable others to understand these various concepts and their relationships, model designers may use various reporting techniques, including specialized diagrams. Each diagram may typically show one or more types of elements and the relationships between those elements. With large models, it may be difficult for users to search such a model to find the desired types of elements within the model. The elements may be needed to populate the specialized diagrams.

Various modeling products may contain element types and may provide several components with public application programming interfaces (API) that may allows programmers to write code that can query a model for desired elements to populate a diagram with the results. However, most users of these products may not have the time and/or the skills necessary to write the required code to implement such a query mechanism. Although users may use existing product features to populate the diagrams manually, such a task may be time consuming and with large models there may be a risk of missing elements needed to populate the diagrams.

BRIEF SUMMARY OF THE INVENTION

In one embodiment, a method may comprise providing an architectural model having a plurality of elements of one or more types. The method may further comprise providing a platform for a user to develop a non-software code query relating to the elements of the model. The method may also comprise executing the developed query to extract one or more of the plurality of elements from the model. The method may additionally comprise populating a diagram with the extracted one or more of the plurality of elements.

In another embodiment, a computer program product for visually modeling architectures or system designs may comprise a computer-readable storage medium having computer readable program code embodied therewith. The computer readable program code may comprise computer readable program code configured to implement a method for visually modeling architectures or system designs. The method may include providing an architectural model having a plurality of elements of one or more types. The method may further include providing a platform for a user to develop a non-software code query relating to the elements of the model. The method may also include executing the developed query to extract one or more of the plurality of elements from the model. The method may additionally include populating a diagram with the extracted one or more of the plurality of elements.

In yet another embodiment, a system may comprise a computing network including a processing device in communication with one or more computer memory storage devices. The computing network may be further configured to implement a method for visually modeling architectures or system designs. The method may include providing an architectural model having a plurality of elements of one or more types. The method may further include providing a platform for a user to develop a non-software code query relating to the elements of the model. The method may also include executing the developed query to extract one or more of the plurality of elements from the model. The method may additionally include populating a diagram with the extracted one or more of the plurality of elements.

In still another embodiment, a method may comprise providing an architectural model having a plurality of elements of one or more types. The method may further comprise providing an architectural model having a plurality of elements of one or more types and having relationships among the elements in each of the one or more types of elements. The method may also comprise extracting one or more of the elements from the model from a derived user-defined non-software code query. The method may additionally comprise populating a diagram with at least one of the extracted one or more of the plurality of elements.

In yet another embodiment a computer program product for visually modeling architectures or system designs may comprise a computer-readable storage medium having computer readable program code embodied therewith. The computer readable program code may be configured to implement a method for visually modeling architectures or system designs. The method may further include providing an architectural model having a plurality of elements of one or more types and having relationships among the elements in each of the one or more types of elements. The method may also include extracting one or more of the elements from the model from a derived user-defined non-software code query. The method may additionally include populating a diagram with at least one of the extracted one or more of the plurality of elements.

The details of one or more implementations are set forth in the accompanying drawings and the description below. Other features and advantages will become apparent from the description, the drawings, and the claims.

DETAILED DESCRIPTION OF THE INVENTION

Figure 1:
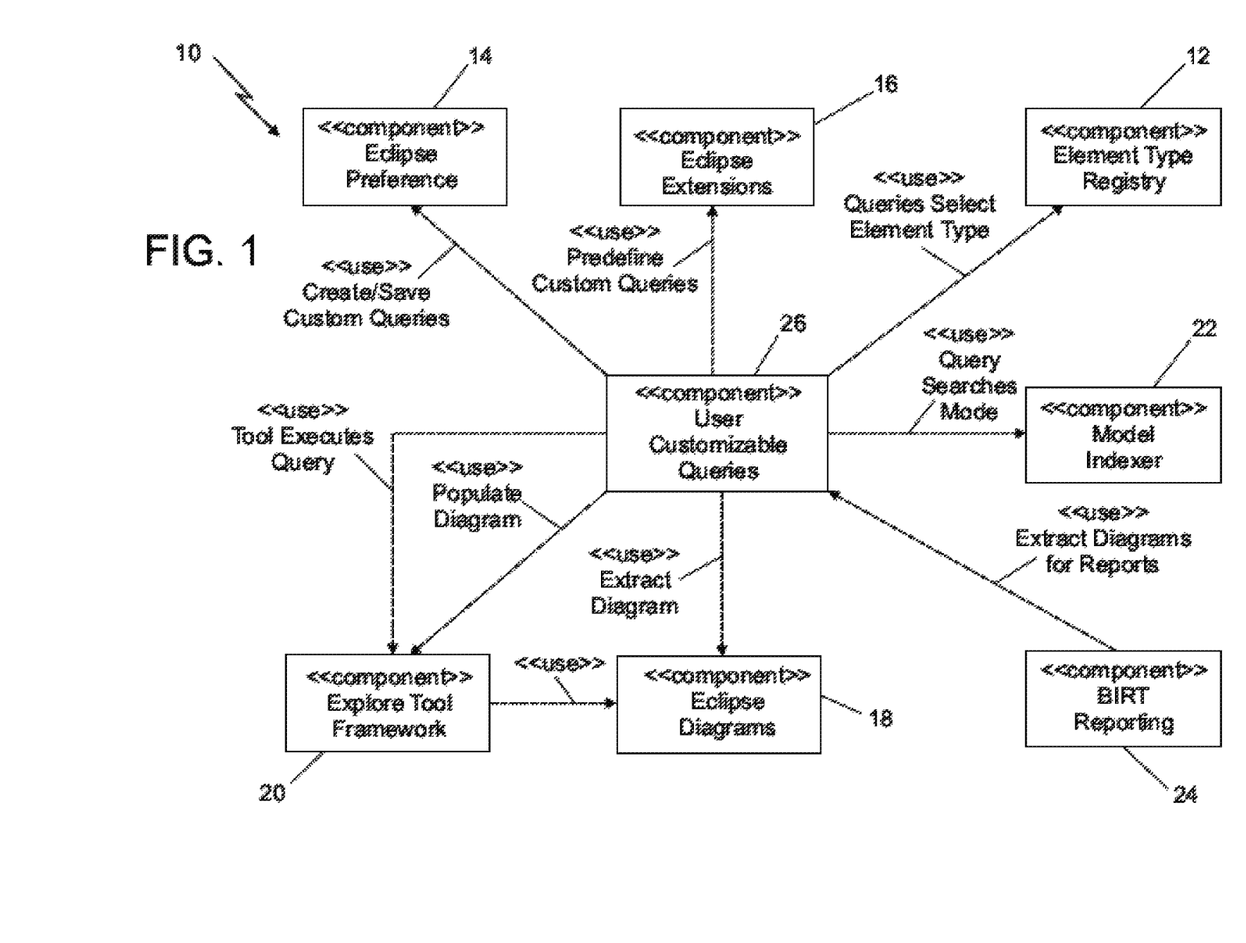
FIG. 1 is a model diagram that shows the various components of a modeling product in which user customizable queries of embodiments of the present invention may reside.

With reference to FIG. 1, there is illustrated a model diagram that shows the various components of a modeling product 10 and their interrelationships in which user customizable queries of embodiments of the present invention may reside. Modeling products such as that shown in FIG. 1 may provide frameworks or components that allow developers to add custom features to these products, such as embodiments of the present invention. The components illustrated in FIG. 1 may include an element type registry 12, an Eclipse™ preferences dialog and storage mechanism 14, an Eclipse extensions registry 16, an Eclipse diagram component 18, a diagram explore tool framework 20, a model indexing component 22, and a business intelligence and reporting tools (BIRT) component 24.

The element type registry 12 may provide a method to distinguish types of elements in an architectural model based upon some characteristic or element property values. For example, a Universal Modeling Language 2 (UML2) profile with stereotypes may be applied to a model and elements may be stereotyped to indicate domain concepts. Element types may then be defined for each stereotype to identify those elements that correspond to specific domain concepts.

The preferences dialog and storage mechanism 14 may allow for custom preference pages that may enable users to specify parameters for functionality in the product. The preferences storage mechanism 14 may save these parameters so that they may be referenced in subsequent product sessions. This storage mechanism 14 may also allow one user to export the preferences so that another user may import and use them.

The Eclipse extensions registry 16 may enables developers to define custom data that may be integrated into an existing feature in the product. For example, embodiments of the present invention may define an extension point for predefining custom queries. Queries defined using this extension point may be automatically made available to all users of that modeling product.

The Eclipse diagram component 18 may provide a notation meta model for constructing shapes and connectors on diagrams.

The explore tool framework 20 may enable developers to define diagram palette tools that have associated query logic, written as software code. When an explore tool is selected by the user, its corresponding query code may be executed and the results may be added to the selected diagram. The explore tool framework 20 may also enable the user to save a representation of the corresponding query and its parameters on the diagram. A diagram refresh button may update the elements shown on the diagram by once again executing the code that corresponds to the saved custom queries. The embodiments of the present invention may provide the logic for an explore tool framework 20 query that may enable users to define and execute non-software coded custom queries.

The model indexing component 22 may provide a relatively efficient mechanism for finding elements in models that may match selected criteria such as elements that correspond to a specific element type.

The BIRT component 24 may enable users to design report templates and to generate reports using a template and associated models. When designing a report, the user may desire to include all diagrams from the associated models that have specific saved custom queries. As described in detail hereinafter, embodiments of the present invention may provide a mechanism to locate and extract the desired diagrams into a generated report.

FIG. 1 also illustrates a user customizable queries component 26, which may build on the model diagram components 12-24 described hereinabove to provide users with a platform to define custom queries that may be executed to search models or portions of models for selected element types, to populate diagrams with the resulting found elements, and to extract the diagrams into generated reports—all without having to write any code.

Figure 3:
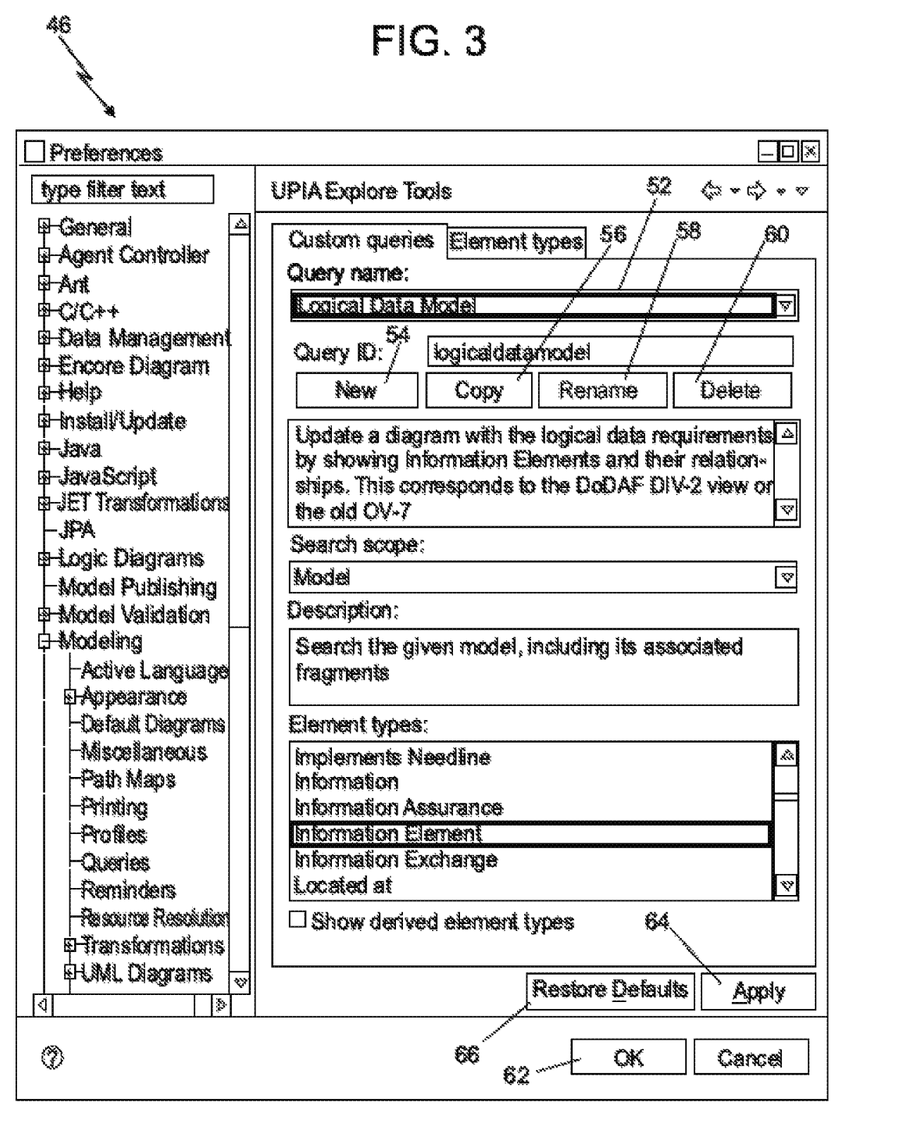
FIG. 3 illustrates an exemplary custom query preference page on a computer screen that enables a user to create, modify and delete custom queries in accordance with embodiments of the present invention.

In accordance with embodiments of the present invention, users may define or create custom queries using a preference page (FIG. 3). When defining a custom query, the user may specify several parameters, including the desired groups of element types and the scope for searching the model, including the relationships for the groups of elements based on one or more element types. The created custom queries and their parameters may be saved in the Eclipse preference storage mechanism 14. A single diagram explore palette tool may enable the user to choose which custom query to execute on a particular diagram. When a custom query is executed, the model indexing component 22 and the specified search scope may be used to locate the model elements that correspond to the desired element types and the results may be added to the diagram. After the custom query is executed, the explore tool framework 20 may allow the user to save that custom query on the diagram for subsequent refreshes. That is, when the custom query is rerun the diagram may be updated with any new elements located (i.e., the diagram may not be regenerated from scratch). The query may be saved on a diagram if the user later desires to include the diagram in a report.

Embodiments of the invention define a BIRT callable function which may be referenced when designing a BIRT report template. One of the function parameters may identify a specific custom query. When a BIRT report is generated using that template with associated models, that function may be called and it may extract the diagrams that may contain the given custom query and may add them into the generated report.

In order to have consistent diagrams, embodiments of the invention may provide an Eclipse extension point to predefine custom queries. Developers and Information Technology (IT) specialists may typically use this extension in a custom plug-in. When that plug-in is deployed into the product, those custom queries may be automatically available to all of their users.

Embodiments of the invention may be relatively tightly coupled with the explore tool framework 20. The explore tool framework 20 may provide Eclipse extension points and API to define tools for the explore tab of a diagram palette. The framework 20 may be designed for developers to create tools that may run a query to extract desired elements from a model and to add the results to a diagram. Each explore tool may be designed to run a single specific query with optional parameters. Embodiments of the user customizable queries of the present invention may extend this framework so that a single explore tool actually represents multiple different queries, where the queries may not be defined in code by the developer but may be specified by users of the product.

Figure 2:
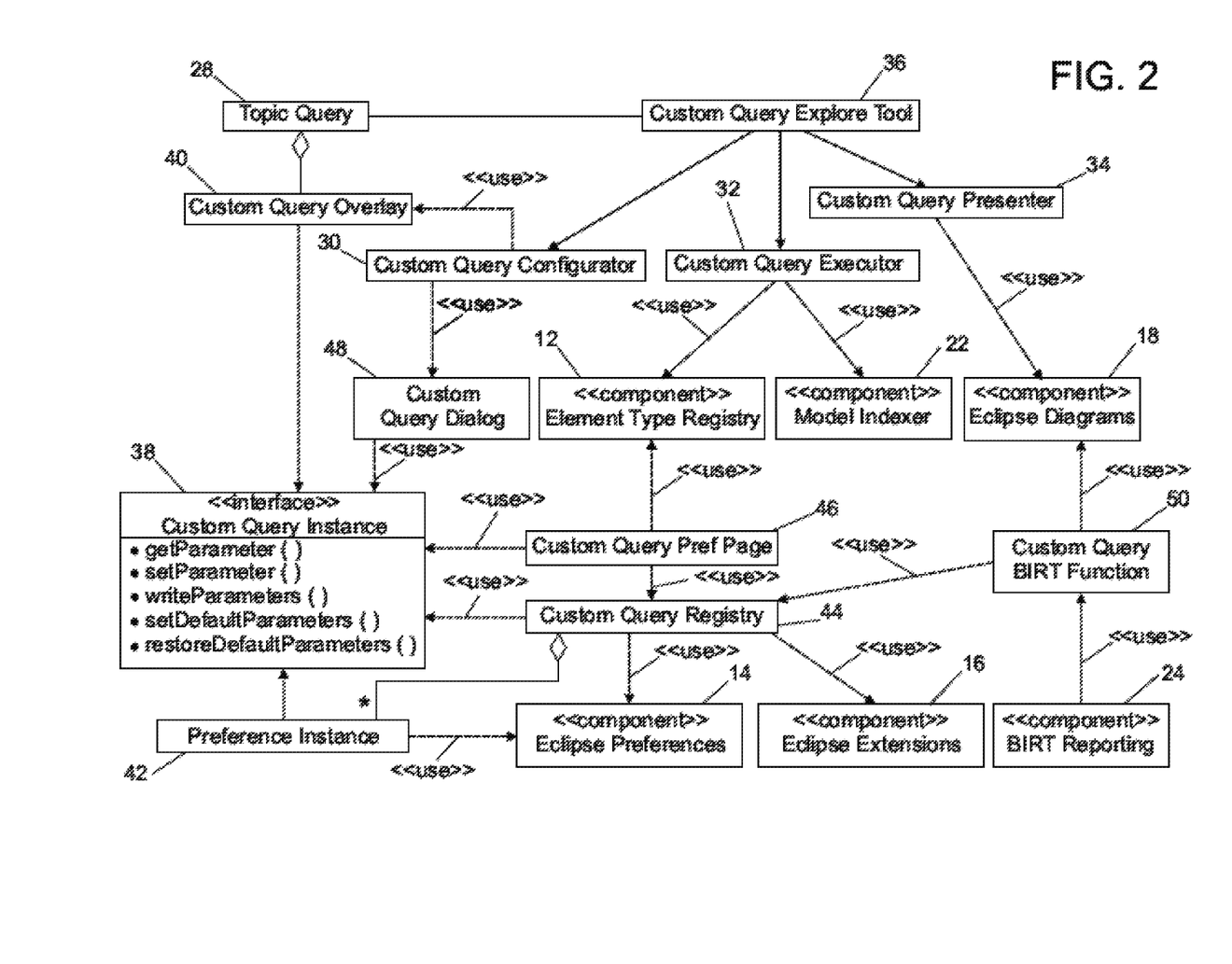
FIG. 2 is a more detailed model diagram that shows the various components of the modeling product of FIG. 1 in which user customizable queries of embodiments of the present invention may reside.

Referring to the more detailed model diagram of FIG. 2, in the explore tool framework 20 each explore tool may have an associated topic query model 28, which may define some basic information about the explore tool, and three associated classes (code) which may perform the processing of the tool—the configurator 30, the executor 32, and the presenter 34. When the explore tool is selected on a diagram, an overlay (instance) of the topic query model may be created with the default values for the parameters. The three classes 30-34 may then called in order. The query configurator 30 may use the overlay to determine if any of the parameter values should be updated. If so, the parameter values in the overlay may be changed. The query executor 32 may use the updated parameters from the overlay and may search for the semantic elements that may be displayed on the diagram. The query presenter 34 may take the semantic element results of the executor 32 and may add the corresponding shapes and connectors to the diagram. When the user chooses to save the query on the diagram, the overlay object may be persisted, along with its parameter values.

In accordance with embodiments of the present invention, the user customizable queries feature 26 (FIG. 1) may use a single custom query explore tool 36, along with specific embodiments of the configurator 30, the executor 32, and the presenter 34 classes. Individual custom queries may be represented by objects that implement the interface custom query instance 38. There are two classes that may implement this interface 38: the custom query overlay 40 and the preference instance 42. Both of these classes 40, 42 may implement the methods defined on the interface 38 for manipulating the parameters of the instance 38. The custom query overlay 40 may encapsulates the overlay created by the explore tool framework 20 and may store its parameters on the diagram. The preference instance 42 may be created by a custom query registry 44 and it may store its parameters in the Eclipse preferences component 14. The query registry 44 may also use the Eclipse extensions component 16 to obtain the data needed to create the predefined custom queries. A custom query preference page 46 may use the query registry 44 and the element type registry 12 to create, modify and delete the user's custom queries. A custom query dialog 48 may be displayed by the configurator 30 when the explore tool is used. This dialog may enable the user to choose which custom query to be executed.

Every custom query instance 38, including saved overlays, may include the following parameters which may be specified by the user: custom query name; description of the custom query; custom query identifier (must be unique and not translated); search scope; list of element types; and flag to include specializations of the selected element types.

The custom query name and description may indicate the type of data to be added to the diagrams when the query is executed. When a topic overlay corresponding to a custom query is saved to the diagram, all of the parameters may be saved. When generating a BIRT report, the user may extract diagrams that have a specific saved custom query. The parameter including the custom query identifier may be used to distinguish the overlays because it may be unique and may not be affected by different locales. The names of predefined custom queries may typically be translated.

The search scope for a custom query may assume the following containment structure. The Eclipse workspace may contain one or more projects. Each project may contain one or more models and each model may have a hierarchy of containers called packages. The choices for the search scope may be package, package hierarchy, model, project or workspace. The selected search scope may always be relative to the project, model and package that contain the selected diagram. The package hierarchy search scope may correspond to the current package and all of its contained packages.

The list of element types may determine those elements that will be shown on the corresponding diagram. Some element types may not be available because there may be different types of diagrams that may have restrictions on the elements that can be shown.

In the element type registry 12, one element type may be a specialization of another element type. For example in the automotive domain, the element type Vehicle might have specializations Car, Motorcycle and Truck. Setting the parameter to include specializations, or derived element types, means that the user may select the root element type and all elements whose types are specializations are also added to the diagram.

As described hereinabove, the user customizable query feature of embodiments of the present invention may use a query registry 44 to maintain the available custom query instances. At startup time, this registry may examine an extension point 16 for predefined custom queries and may create an instance for each query. The parameters from the extension may become the default parameter values for the query instance. In the query instance, the default parameter values may be kept separate from the current values so that the user may override those default values or reset the query instance back to the default values. After the extensions are processed, the registry examines the preference storage mechanism 14 for user defined queries. If a user defined query corresponds to a predefined query, then the current parameter values of the existing query instance may be updated from the preference storage. If a user defined query does not correspond to a predefined query, a new instance may be created with the preference parameter values.

Referring to FIG. 3, there is illustrated an exemplary custom query preference page 46 on a computer screen that may enable a user to create, modify and delete custom queries in accordance with embodiments of the present invention. The drop-down box 52 at the top right in FIG. 3 typically may include all of the then-known custom queries, both predefined and user defined. The "New" button 54 may create a new custom query with default parameter values, while the "Copy" button 56 may create a new custom query with the current parameter values that were defined for the selected query. In both cases, the user may specify the name and a unique identifier for the new custom query. Verification of the identifier may be performed to ensure it is unique and conforms to any design restrictions on its format. The "Rename" button 58 and the "Delete" button 60 may typically be available only for user defined queries. Predefined custom queries (defined in extensions) generally may not be renamed or deleted. Also, when an existing user custom query is renamed, the query identifier generally may not be changed. All other query parameter values (e.g., query description, search mode, and a list of element types to search for) may be changed in the preference page 46. When the "OK" button 62 or the "Apply" button 64 is selected, the updated values may be written back to the Eclipse preference storage 14 (FIG. 1). When the "Restore Defaults" button 66 is selected, the default values for the selected query may be copied over its current values.

Figure 4:
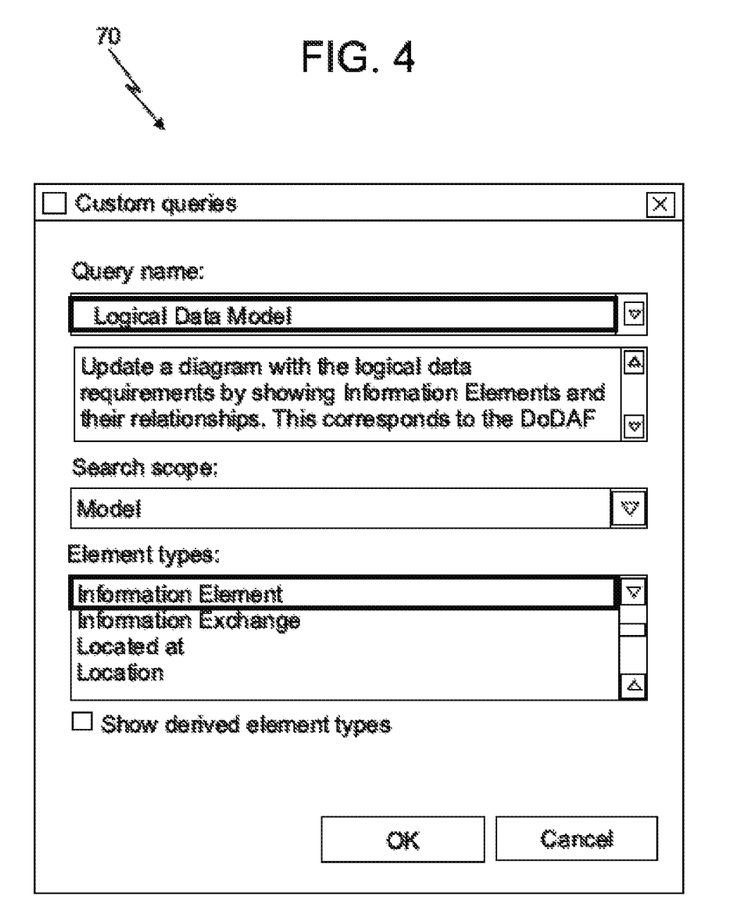
FIG. 4 illustrates an exemplary dialog box on a computer screen to allow the user to choose a query to execute and to modify some parameters, if necessary, before executing the query on a diagram.

Referring to FIG. 4, when the custom query explore tool is selected on a diagram, the user may indicate which custom query to execute, including any newly created custom queries. FIG. 4 illustrates an example of a dialog box 70 that may appear on the computer screen and may allow the user to choose the desired query to execute and to modify some parameters, if necessary, of the query before its execution. After the custom query runs, the user may save the query on the diagram to refresh the diagram relatively quickly by re-running the query again and to explicitly extract the diagram into a BIRT generated report. If the query is saved on the diagram, an outline view 86 (FIG. 5) may show the name of the custom query. The diagram refresh may be handled automatically by the explore tool framework 20 (FIG. 1). All of the queries (overlays) saved on the diagram may be executed again by calling the corresponding explore tool classes.

A custom query BIRT function 50 (FIG. 2) may be registered as an xpath function, and may be specified in an expression when defining a BIRT data set. This function may take two parameters—a set of model objects that may contain diagrams, and a string to identify the custom query that may be saved on those diagrams. Although the latter parameter is to be the custom query identifier, the report designer may also specify the query name. When doing the lookup, the name specified as a parameter and the names and identifiers of saved custom queries may be normalized to make matching easier. The normalization converts the strings to lower case and removes spaces and commas. For each diagram and each saved query on a diagram, the lookup function first may compare the query identifier with the specified parameter and then may compare the query name. If either matches then that diagram may be included in the output set of diagrams.

Figure 5:
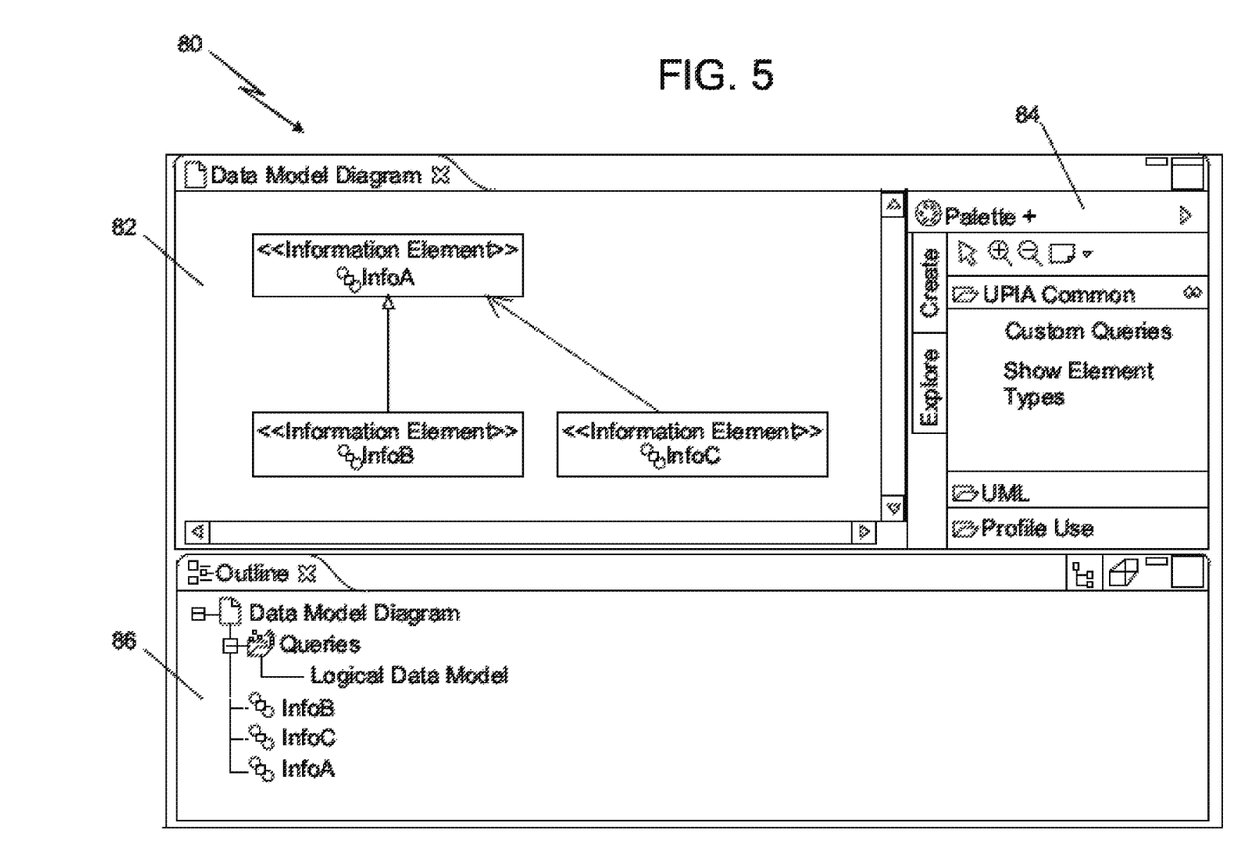
FIG. 5 is a diagram that illustrates the results of a query along with the diagram palette and an outline view of the diagram.

Referring to FIG. 5, a sample UML model may be created and populated with multiple elements of the type <<Information Element>> along with several relationships created between the elements, including a UML generalization and a dependency. FIG. 5 illustrates a model diagram called "Data Model Diagram" 80 and the custom query logical data model may be executed and saved on that diagram 80. FIG. 5 shows the results 82 of the query on the diagram 80 along with the diagram palette 84 and an outline view 86 of the diagram. The custom queries tool 26 (FIG. 1) according to embodiments of the present invention may be shown in the palette 84 and the saved "Logical Data Model" custom query may be listed in the outline view 86.

Figure 6:
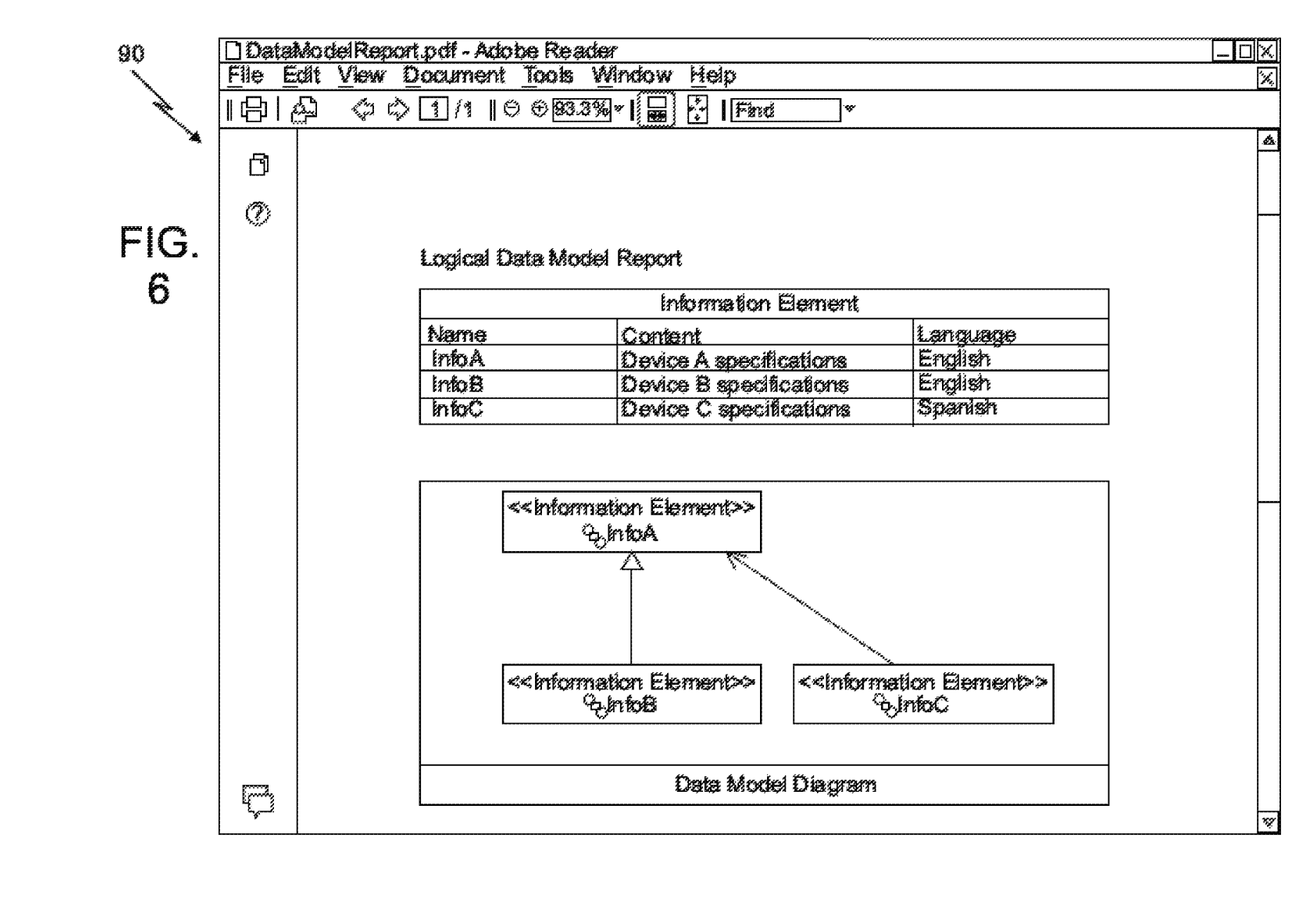
FIG. 6 is a diagram that illustrates a corresponding report generated for a model using a report design template, which extracts the diagram with a saved custom query.

Referring to FIG. 6, a BIRT report design template may be created, which may use the callable BIRT function to extract the diagram with the saved custom query. A corresponding published report 90 may be generated for the model in, e.g., PDF format, as illustrated in FIG. 6.

Embodiments of the present invention provide the user with a tool to define custom queries that may search architectural models or portions of models for selected element types. Embodiments of the invention may also provide a diagram palette tool for the user to execute these custom queries and to populate diagrams with the results. In addition, embodiments of the invention may provide a tool to extract these diagrams into generated reports.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
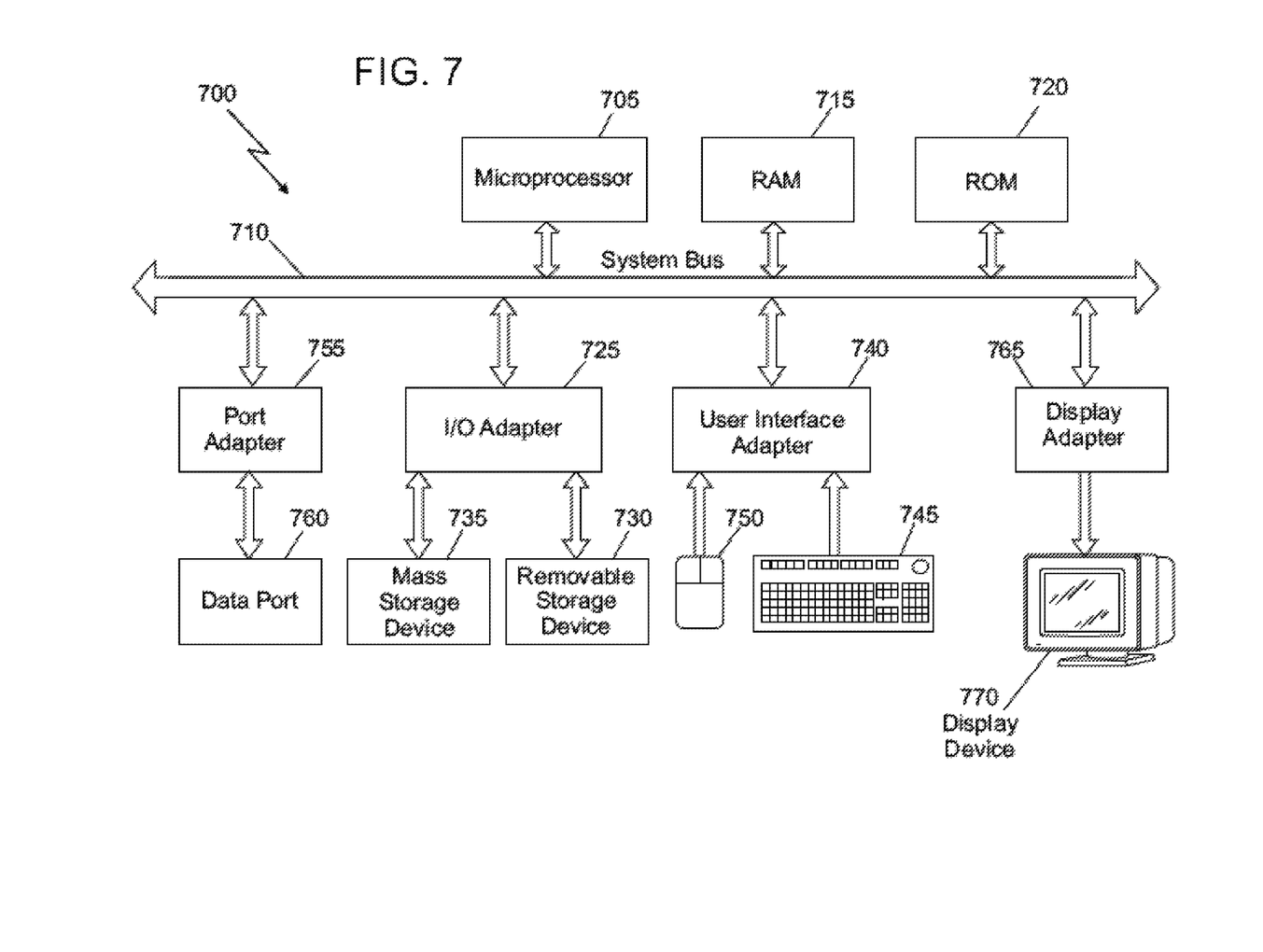
FIG. 7 is a schematic block diagram of a general-purpose computer suitable for practicing embodiments of the present invention.

Referring now to FIG. 7, computer system 700 may have at least one microprocessor or central processing unit (CPU) 705. CPU 705 may be interconnected via a system bus 710 to a random access memory (RAM) 715, a read-only memory (ROM) 720, an input/output (I/O) adapter 725 for a connecting a removable data and/or program storage device 730 and a mass data and/or program storage device 735, a user interface adapter 740 for connecting a keyboard 745 and a mouse 750, a port adapter 755 for connecting a data port 760 and a display adapter 765 for connecting a display device 770.

ROM 720 may include the basic operating system for computer system 700. The operating system may alternatively reside in RAM 715 or elsewhere as is known in the art. Examples of removable data and/or program storage device 730 may include magnetic media such as floppy drives and tape drives and optical media such as CD ROM drives. Examples of mass data and/or program storage device 735 may include hard disk drives and non-volatile memory such as flash memory. In addition to keyboard 745 and mouse 750, other user input devices such as trackballs, writing tablets, pressure pads, microphones, light pens and position-sensing screen displays may be connected to user interface 740. Examples of display devices may include cathode-ray tubes (CRT) and liquid crystal displays (LCD).

A computer program with an appropriate application interface may be created by one of skill in the art and may be stored on the system or a data and/or program storage device to simplify the practicing of embodiments of the invention. In operation, information for, or the computer program created to run, embodiments of the present invention may be loaded on the appropriate removable data and/or program storage device 730, and may be fed through data port 760 or typed in using keyboard 745.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A computer program product for visually modeling architectures or system designs, the computer program product comprising:
    a non-transitory computer-readable storage medium having computer readable program code embodied therewith, the computer readable program code comprising:
    computer readable program code configured to implement a method for visually modeling architectures or system designs, the method further including:
    providing an architectural model having a plurality of elements of one or more types;
    providing a platform for a user to develop a non-software code query relating to the elements of the model, wherein the developed query includes a custom query not currently available to a second user;
    developing a non-software code query relating to the elements of the model by the user and storing the developed query in a query registry;
    determining a second platform for a second user to develop a non-software code query relating to the elements of the model, wherein the second platform does not currently have the developed query by the user available;
    starting UP the second platform for the second user and during the start-up, having the query registry examining an extension point for the developed queries, wherein the developed queries include the query developed by the user, thereby making the developed query by the user available to the second user;
    creating an instance of each developed query from the extension point, and storing the parameters of the queries as default parameter values;
    examining, by the registry, a preference storage for user defined queries, and determining if any user defined queries correspond to any developed queries from the extension wherein if the queries correspond, updating current parameter values of the query with the parameters from the preference storage, otherwise create a new query instance with the preference parameter value;

executing the developed query to extract one or more of the plurality of elements from the model;

populating a diagram with the extracted one or more of the plurality of elements, wherein the diagram includes a diagram palette tool to enable the user and the second user to choose the developed query from among a plurality of previously developed non-software code queries to execute on one of a plurality of diagrams, wherein the diagram palette tool enables overriding of parameter values for the chosen developed query, and wherein modified parameter values are kept separate from the default parameter values and both associated to the chosen developed query;

saving the developed query and the populated diagram, wherein the saved developed query is re-executed and automatically updates the saved populated diagram with any new elements extracted, and wherein the saved developed query corresponds to a predefined custom query with associated overriding parameter values, and updates the predefined custom query to include the modified parameter values of the saved developed query; and extracting the populated diagram into a generated report using a template and associated models.

2. The computer program product of claim 1, wherein providing a platform for a user to develop a non-software code query relating to the elements of the model further comprises:

providing a preference page in which at least one parameter is specified.

3. The computer program product of claim 2, wherein the at least one parameter includes at least one of desired groups of types of the elements and a scope for searching the model based on relationships for the groups of types of the elements.

4. A system, comprising:

a computing network including a processing device in communication with one or more computer memory storage devices; and the computing network further configured to implement a method for visually modeling architectures or system designs, the method further including:

providing an architectural model having a plurality of elements of one or more types;

providing a platform for a user to develop a non-software code query relating to the elements of the model, wherein the developed query includes a custom query not currently available to a second user;

developing a non-software code query relating to the elements of the model by the user and storing the developed query in a query registry;

determining a second platform for a second user to develop a non-software code query relating to the elements of the model, wherein the second platform does not currently have the developed query by the user available;

starting up the second platform for the second user and during the start-up, having the query registry examining an extension point for the developed queries, wherein the developed queries include the query developed by the user, thereby making the developed query by the user available to the second user;

creating an instance of each developed query from the extension point, and storing the parameters of the queries as default parameter values;

examining, by the registry, a preference storage for user defined queries, and determining if any user defined queries correspond to any developed queries from the extension wherein if the queries correspond, updating current parameter values of the query with the parameters from the preference storage, otherwise create a new query instance with the preference parameter value;

executing the developed query to extract one or more of the plurality of elements from the model;

populating a diagram with the extracted one or more of the plurality of elements, wherein the diagram includes a diagram palette tool to enable the user and the second user to choose the developed query from among a plurality of previously developed non-software code queries to execute on one of a plurality of diagrams, wherein the diagram palette tool enables overriding of parameter values for the chosen developed query, and wherein modified parameter values are kept separate from the default parameter values and both associated to the chosen developed query;

saving the developed query and the populated diagram, wherein the saved developed query is re-executed and automatically updates the saved populated diagram with any new elements extracted, and wherein the saved developed query corresponds to a predefined custom query with associated overriding parameter values, and updates the predefined custom query to include the modified parameter values of the saved developed query; and extracting the populated diagram into a generated report using a template and associated models.

5. The system of claim 4, wherein providing a platform for a user to develop a non-software code query relating to the elements of the model further comprises:

providing a preference page in which at least one parameter is specified.

6. The system of claim 5, wherein the at least one parameter includes at least one of desired groups of types of the elements and a scope for searching the model based on relationships for the groups of types of the elements.

7. A computer program product for visually modeling architectures or system designs, the computer program product comprising:

a non-transitory computer-readable storage medium having computer readable program code embodied therewith, the computer readable program code comprising:

computer readable program code configured to implement a method for visually modeling architectures or system designs, the method further including:

providing an architectural model having a plurality of elements of one or more types and having relationships among the elements in each of the one or more types of elements;

providing a platform for a user to develop a derived user-defined non-software code query relating to the elements of the model, wherein the derived user-defined non-software code query includes a custom query not currently available to a second user;

developing a derived user-defined non-software code query relating to the elements of the model by a user and storing the derived user-defined non-software code query in a query registry;

determining a second platform for a second user to develop a non-software code query relating to the elements of the model, wherein the second platform does not currently have the derived user-defined non-software code query by the user available;

starting UP the second platform for the second user and during the start-up, having the query registry examining an extension point for the derived user-defined non-software code queries, wherein the derived user-defined non-software code queries include the query developed by the user, thereby making the derived user-defined non-software code query by the user available to the second user;

creating an instance of each derived user-defined non-software code query from the extension point, and storing the parameters of the queries as default parameter values;

examining, by the registry, a preference storage for user defined queries, and determining if any user defined queries correspond to any derived user-defined non-software code queries from the extension wherein if the queries correspond, updating current parameter values of the query with the parameters from the preference storage, otherwise create a new query instance with the preference parameter value;

extracting one or more of the elements from the model from the derived user-defined non-software code query;

populating a diagram with at least one of the extracted one or more of the plurality of elements, wherein the diagram includes a diagram palette tool to enable the user and the second user to choose the derived user-defined non-software code query from among a plurality of previously developed non-software code queries to execute on one of a plurality of the diagrams, wherein the diagram palette tool enables overriding of parameter values for the chosen derived user-defined non-software code query, and wherein modified parameter values are kept separate from the default parameter values and both associated to the chosen derived user-defined non-software code query;

saving the derived user-defined non-software code query and the populated diagram, wherein the saved user-defined non-software code query is re-executed and automatically updates the saved populated diagram with any new elements extracted, and wherein the saved derived user-defined non-software code query corresponds to a predefined custom query with associated overriding parameter values, and updates the predefined custom query to include the modified parameter values of the saved developed query; and extracting the populated diagram into a generated report using a template and associated models.

8. The computer program product of claim 7, wherein providing a platform for a user to develop a non-software code query relating to the elements of the model further comprises:

providing a preference page in which at least one parameter is specified.

9. The computer program product of claim 8, wherein the at least one parameter includes at least one of desired groups of types of the elements and a scope for searching the model based on relationships for the groups of types of the elements.

* * * * *